US008658288B2

(12) United States Patent
Chien

(10) Patent No.: US 8,658,288 B2
(45) Date of Patent: Feb. 25, 2014

(54) METHOD FOR MANUFACTURING A POROUS DEVICE WITH RESTRICTIVE LAYER AND STRUCTURE THEREOF

(75) Inventor: Kuo-Yu Chien, Chiayi County (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 250 days.

(21) Appl. No.: 13/336,844

(22) Filed: Dec. 23, 2011

(65) Prior Publication Data

US 2013/0164554 A1 Jun. 27, 2013

(51) Int. Cl.
*B32B 3/24* (2006.01)
*C23C 14/14* (2006.01)
*C23C 14/34* (2006.01)
*C23C 14/38* (2006.01)
*B05D 3/12* (2006.01)
*B05D 3/14* (2006.01)
*B05D 3/06* (2006.01)

(52) U.S. Cl.
USPC .......... 428/596; 428/304.4; 428/311.11; 428/315.9; 428/613; 210/506; 210/508; 210/509; 204/192.15; 427/244; 427/245; 427/531; 427/556; 427/255.7; 29/896.6

(58) Field of Classification Search
None
See application file for complete search history.

(56) References Cited

U.S. PATENT DOCUMENTS

| 3,446,906 | A  | * | 5/1969  | Zulauf ........................... 174/383 |
| 6,051,117 | A  | * | 4/2000  | Novak et al. .................. 204/252 |
| 6,423,422 | B2 | * | 7/2002  | Wada et al. ................... 428/550 |
| 7,208,222 | B2 | * | 4/2007  | Rolfe et al. ................. 428/304.4 |
| 7,601,295 | B2 | * | 10/2009 | Tomari et al. ..................... 419/2 |

FOREIGN PATENT DOCUMENTS

GB 2385008 * 8/2003
JP 7-275623 * 10/1995

OTHER PUBLICATIONS

Abstract for KR 2009018015 A, Feb. 19, 2009.*

* cited by examiner

*Primary Examiner* — John J Zimmerman
(74) *Attorney, Agent, or Firm* — Jackson IPG PLLC

(57) ABSTRACT

A method for manufacturing a porous device with restrictive layer comprises the steps of providing a porous structure having a micro pore structure, flattening the porous carrier to form a surface, and forming a restrictive layer on the surface of the porous carrier, a method for manufacturing said restrictive layer includes forming a nickel-chromium alloy layer on the surface of the porous carrier, forming a copper metal layer on the nickel-chromium alloy layer, forming a nickel metal layer having a top surface on the copper metal layer, and processing said nickel-chromium alloy layer, said copper metal layer and said nickel metal layer to form a plurality of channels communicating with the micro pore structure and the top surface. The restrictive effect and damping effect can raise anti-vibration ability of the porous device itself by formation of dual restrictive structure composed of the micro pore structure and the channels.

13 Claims, 5 Drawing Sheets

METHOD FOR MANUFACTURING A POROUS DEVICE WITH RESTRICTIVE LAYER AND STRUCTURE THEREOF

FIELD OF THE INVENTION

The present invention is generally related to a method for manufacturing a porous device and structure thereof, which particularly relates to the method for manufacturing a porous device with restrictive layer and structure thereof

BACKGROUND OF THE INVENTION

With reference to FIG. 3, a conventional porous device 200 merely comprises a porous structure 210, and a fluid pressure system (not shown in Figure) is utilized for transmitting high pressure fluid to the porous device 200 and bearing a heavy workpiece (not shown in Figure) by feature of restriction effect. However, the porous structure 210 is limited by its original material characteristics so that the diameter and arrangements for the porous structure 210 is uncontrollable, which may lead the flow rate of the porous structure 210 and the surface flow field of the porous device 200 to be unable to control as well. Therefore, the application field of the porous device 200 is limited substantially.

SUMMARY

The primary object of the present invention is to provide a method for manufacturing a porous device with restrictive layer comprising the steps of providing a porous structure having a micro pore structure, flattening the porous carrier to form a surface, and forming a restrictive layer on the surface of the porous carrier, wherein a method for manufacturing said restrictive layer includes forming a nickel-chromium alloy layer on the surface of the porous carrier, forming a copper metal layer on the nickel-chromium alloy layer, forming a nickel metal layer having a top surface on the copper metal layer, and processing said nickel-chromium alloy layer, said copper metal layer and said nickel metal layer to form a plurality of channels communicating with the micro pore structure and the top surface. By formation of dual restrictive structure composed of the micro pore structure and the channels of the restrictive layer, as long as the high pressure fluid passes by said micro pore structure and said channels, the restrictive effect and high damping effect can raise rigidity, bearing force and anti-vibration ability of the porous device itself effectively. Accordingly, this invention can be widely used in all sorts of high precision processing equipments, inspection equipments and equipments for the field of Optoelectronic semiconductor. Besides, the surface flow field of the top surface of the nickel metal layer in the porous device with restrictive layer can be adjustable by means of thickness of restrictive structure, channel size and arrangements of the channels.

DETAILED DESCRIPTION OF THE INVENTION

Figure 1:
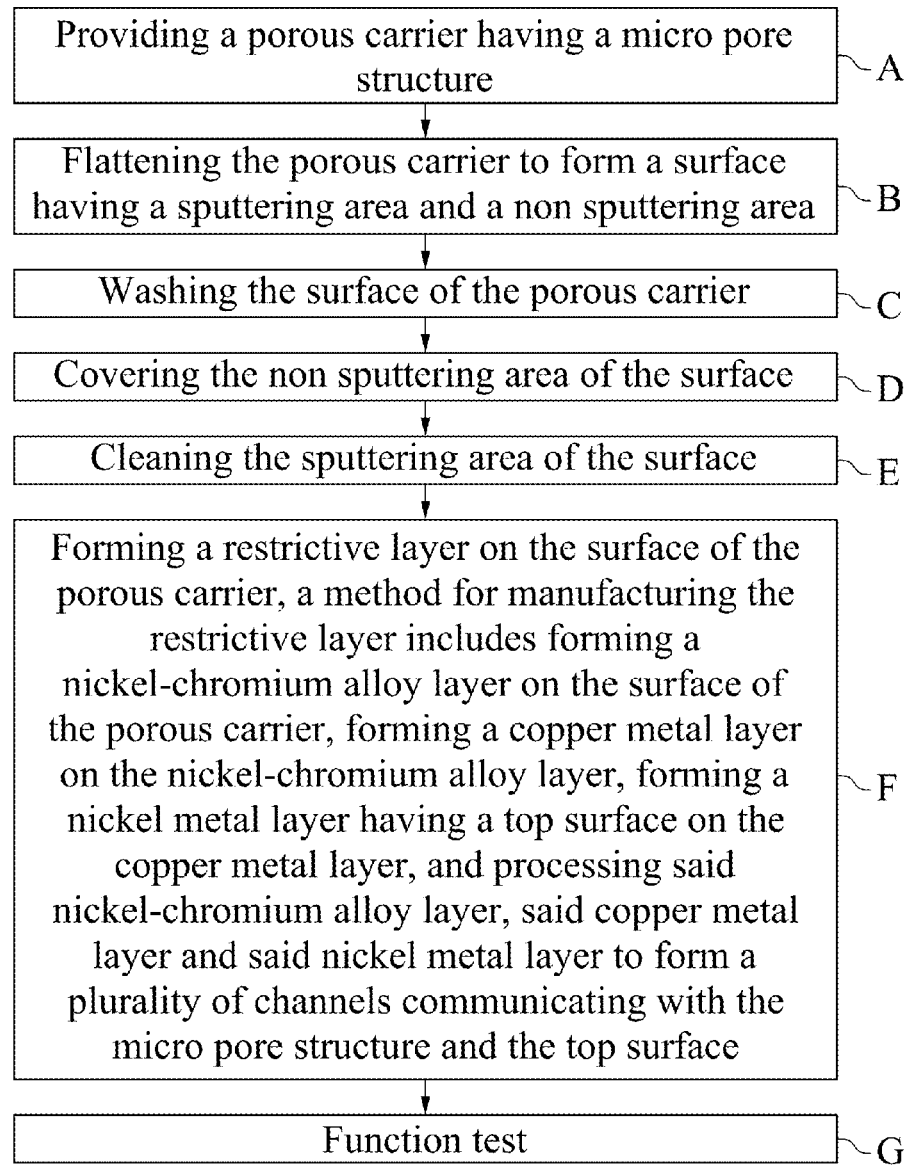
FIG. 1 is a manufacturing flow illustrating a method for manufacturing a porous device with restrictive layer in accordance with a preferred embodiment of the present invention.

With reference to FIGS. 1 and 2A to 2E, a method for manufacturing a porous device with restrictive layer in accordance with a preferred embodiment of the present invention comprises the steps as followed. First, referring to step A in FIG. 1 and FIG. 2A, providing a porous carrier 110 having a micro pore structure 111, and the material of the porous carrier 110 can be chosen from one of porous graphite, ceramics or copper. Next, referring to step B in FIG. 1 and FIG. 2A, step B is to flatten the porous carrier 110 to form a surface 112, and mentioned surface 112 comprises a sputtering area A1 and a non sputtering area A2. In this embodiment, the porous carrier 110 is flattened by method of grinding and polishing. Thereafter, referring to step C in FIG. 1, step C is to wash the surface 112 of the porous carrier 110. Referring to step D in FIG. 1, step D is to cover the non sputtering area A2 of the surface 112, in this embodiment, the step of washing the surface 112 of the porous carrier 110 is between the steps of flattening the porous carrier 110 to form the surface 112 and forming a nickel-chromium alloy layer 121 on the surface 112 of the porous carrier 110. With reference to step E in FIG. 1, step E is to clean the sputtering area A1 of the surface 112. Referring to step F in FIG. 1 and FIGS. 2B to 2E, forming a restrictive layer 120 on the sputtering area A1 of the surface 112 of the porous carrier 110, in this embodiment, the step of cleaning the sputtering area A1 of the surface 112 is between the steps of covering the non sputtering area A2 of the surface 112 and forming the restrictive layer 120 on the sputtering area A1 of the surface 112 of the porous carrier 110.

A method for manufacturing the restrictive layer 120 comprises the steps as below. First, referring to step F in FIG. 1 and FIG. 2B, forming the nickel-chromium alloy layer 121 on the sputtering area A1 of the surface 112 of the porous carrier 110, wherein the forming method for nickel-chromium alloy layer 121 can be chosen from one of vacuum sputtering, vacuum evaporation, or ion implantation. In this embodiment, the nickel-chromium alloy layer 121 is formed via vacuum sputtering. Next, referring to step F in FIG. 1 and FIG. 2C, forming a copper metal layer 122 on the nickel-chromium alloy layer 121 and washing a surface of the copper metal layer 122, wherein the forming method for copper metal layer 122 can be chosen from one of vacuum sputtering, vacuum evaporation, or ion implantation. In this embodiment, the copper metal layer 122 is formed via vacuum sputtering, and the nickel-chromium alloy layer 121 is utilized for raising the bonding strength between the porous carrier 110 and the copper metal layer 122. With reference to step F in FIG. 1 and FIG. 2D, forming a nickel metal layer 123 having a top surface 123a on the copper metal layer 122, wherein the forming method of the nickel metal layer 123 is chemical deposition. Preferably, the nickel metal layer 123 is formed via Electroless Nickel deposition. Then, proceed to inflate the porous carrier 110 for a first inflation test. Once a plurality of apertures or openings formed between mentioned metal layers and the surface 112, the test gas may pass through the micro pore structure 111 and leak out from mentioned apertures or openings in the first inflation test. Therefore, the first inflation test is utilized for inspection of whether the nickel-chromium alloy layer 121, the copper metal layer 122 and the nickel metal layer 123 can firmly seal the surface 112 of the porous carrier 110 to prevent leakage from happening Later, trimming the top surface 123a of the nickel metal layer 123, wherein the thickness of the nickel metal layer 123 is controllable via precisely diamond turning Preferably, after trimming the nickel metal layer 123, the thickness of the nickel metal layer 123 ranges from 0.01 to 0.2 mm. In this embodiment, the step of inflating the porous carrier 110 for the first inflation test is between the steps of forming the nickel metal layer 123 on the copper metal layer 122 and trimming the top surface 123a of the nickel metal layer 123. Afterwards, proceed to inflate the porous carrier 110 for a second inflation test. The nickel-chromium alloy layer 121, the copper metal layer 122 and the nickel metal layer 123 might be partially or fully removed by operation errors or insufficient precision of diamond turning. The second inflation test is utilized for confirmation of whether mentioned metal layers being removed. With reference to step F in FIG. 1 and FIG. 2E, processing said nickel-chromium alloy layer 121, said copper metal layer 122 and said nickel metal layer 123 to form a plurality of channels 124 in communication with the micro pore structure 111 and the top surface 123a. The forming method for the channels 124 can be chosen from one of laser, electro discharging machining or micro milling. In this embodiment, mentioned channels 124 are formed via short pulse laser. Besides, various arrangements of the channels 124 for the porous device with restrictive layer 100 determine the surface flow field of the top surface 123a of the nickel metal layer 123. Each of the channels 124 can be a vent hole or a slot, and mentioned vent hole comprises a diameter in the range from 0.001 to 0.8 mm. Preferably, the arrangements of the channels 124 can be formed into a square shape, a triangular shape, a round shape, an elliptic shape, a star shape or a cross shape so as to control the flow rate of high pressure fluid and distribution of surface flow field. The step of inflating the porous carrier 110 for the second inflation test is between the steps of trimming the top surface 123a of the nickel metal layer 123 and processing said nickel-chromium alloy layer 121, said copper metal layer 122 and said nickel metal layer 123. In this embodiment, the restrictive layer 120 is composed of the nickel-chromium alloy layer 121, the copper metal layer 122, the nickel metal layer 123 and the channels 124, and the porous device with restrictive layer 100 is composed of the porous carrier 110 and the restrictive layer 120. Referring to step G in FIG. 1, after the step of forming the restrictive layer 120 on the surface 112 of the porous carrier 110, the method for manufacturing a porous device further includes a function test for the porous device with restrictive layer 100, wherein the testing functions include flow rates through the micro pore structure 111 and the channels 124, inlet/outlet pressure variation, static/dynamic rigidity test, fluid film thickness, stability, and bearing force for the porous device with restrictive layer 100.

Figure 2A:
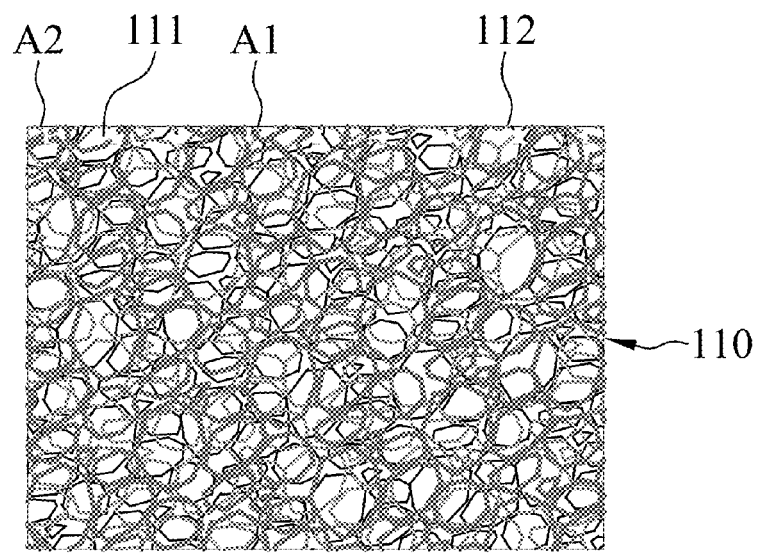
FIGS. 2A to 2E are section views illustrating a method for manufacturing a porous device with restrictive layer in accordance with a preferred embodiment of the present invention.
Figure 2B:
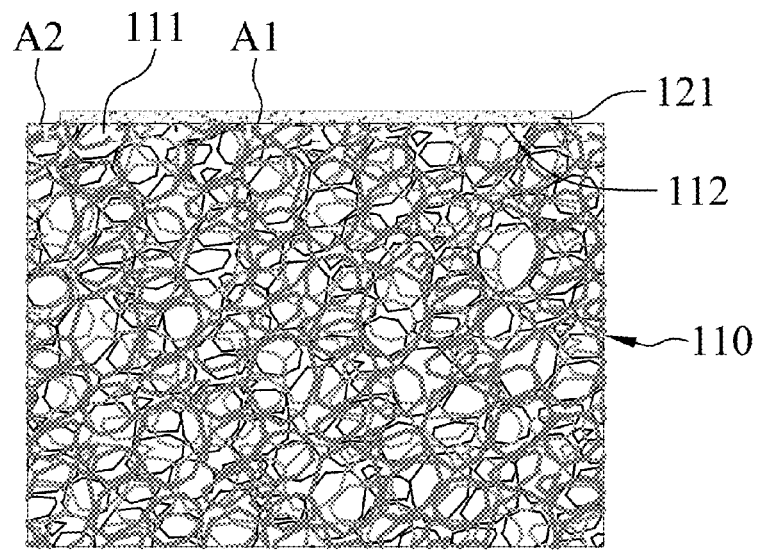
Figure 2C:
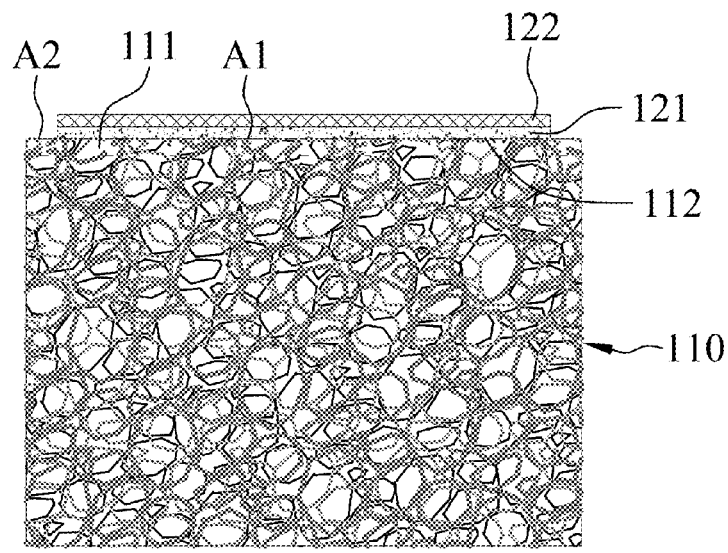
Figure 2D:
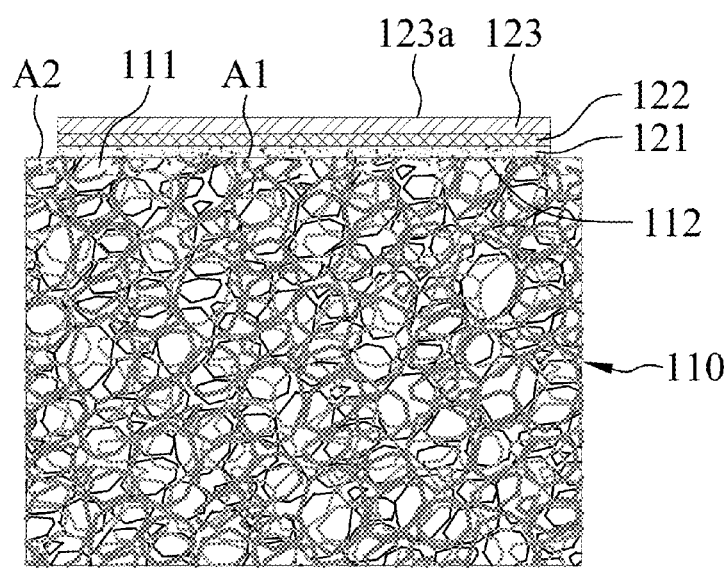
Figure 2E:
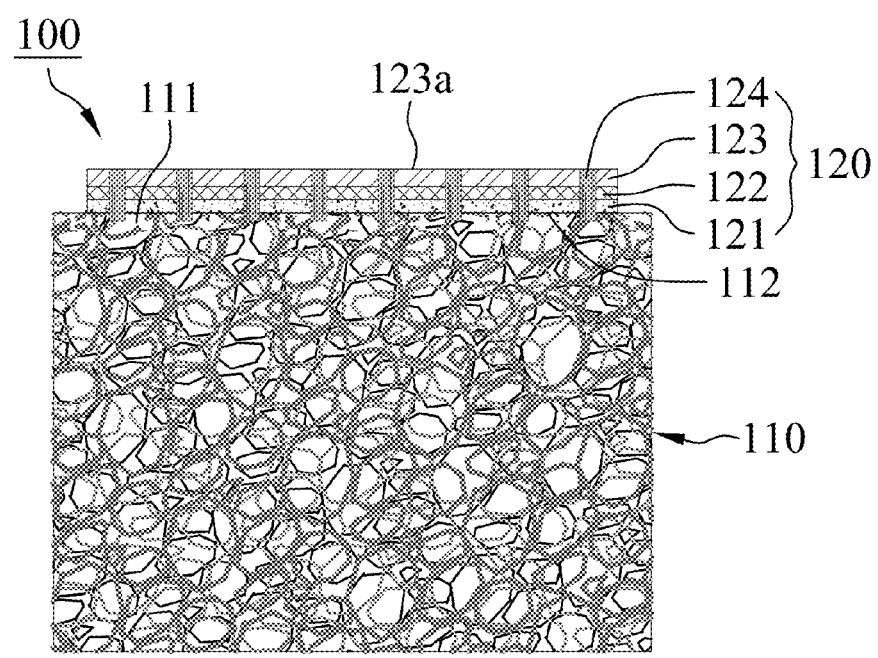
Figure 3:
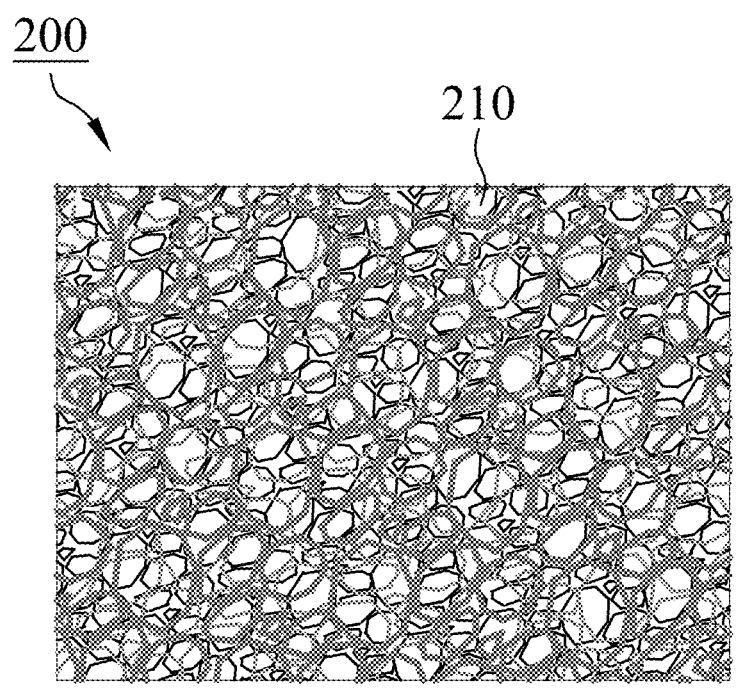
FIG. 3 is a section view illustrating a conventional porous device.

With reference to FIG. 2E, a porous device with restrictive layer 100 comprises a porous carrier 110 and a restrictive layer 120, wherein the porous carrier 110 comprises a micro pore structure 111 and a surface 112, and the restrictive layer 120 comprises a nickel-chromium alloy layer 121, a copper metal layer 122, a nickel metal layer 123 and a plurality of channels 124. The nickel-chromium alloy layer 121 is disposed on the surface 112 of the porous carrier 110, the copper metal layer 122 is disposed on the on the nickel-chromium alloy layer 121, the nickel metal layer 123 is disposed on the copper metal layer 122 and comprises a top surface 123a, the channels 124 are in communication with the micro pore structure 111 and the top surface 123a of the nickel metal layer 123. In this embodiment, the thickness of mentioned nickel-chromium alloy layer 121 ranges from 0.1 to 3 μm, the thickness of mentioned copper metal layer 122 ranges from 0.1 to 3 μm, and the thickness of nickel metal layer 123 ranges from 0.001 to 0.3 mm.

In this invention, by formation of dual restrictive structure composed of the micro pore structure 111 and the channels 124, as long as high pressure fluid passes by said micro pore structure 111 and said channels 124, the restrictive effect and high damping effect can raise rigidity, bearing force and anti-vibration ability of the porous device with restrictive layer 100 itself effectively. Accordingly, this invention can be widely used in all sorts of high precision processing equipments, inspection equipments and equipments for the field of Optoelectronic semiconductor. Besides, the surface flow field of the top surface 123a of the nickel metal layer 123 in the porous device with restrictive layer 100 can be adjustable by means of thickness of restrictive structure, channel size and arrangements of the channels 124.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A method for manufacturing a porous device with restrictive layer comprising:
   providing a porous carrier having a micro pore structure;
   flattening the porous carrier to form a surface; and
   forming a restrictive layer on the surface of the porous carrier, wherein a manufacturing method for said restrictive layer includes forming a nickel-chromium alloy layer on the surface of the porous carrier, forming a copper metal layer on the nickel-chromium alloy layer, forming a nickel metal layer having a top surface on the copper metal layer, and processing mentioned nickel-chromium alloy layer, mentioned copper metal layer and mentioned nickel metal layer to form a plurality of channels in communication with the micro pore structure and the top surface.

2. The method for manufacturing a porous device with restrictive layer in accordance with claim 1 further includes trimming the top surface of the nickel metal layer between the steps of forming the nickel metal layer on the copper metal layer and processing mentioned nickel-chromium alloy layer, mentioned copper metal layer and mentioned nickel metal layer.

3. The method for manufacturing a porous device with restrictive layer in accordance with claim 2 further includes inflating the porous carrier for a first inflation test between the steps of forming the nickel metal layer on the copper metal layer and trimming the top surface of the nickel metal layer.

4. The method for manufacturing a porous device with restrictive layer in accordance with claim 2 further includes inflating the porous carrier for a second inflation test between the steps of trimming the top surface of the nickel metal layer and processing mentioned nickel-chromium alloy layer, mentioned copper metal layer and mentioned nickel metal layer.

5. The method for manufacturing a porous device with restrictive layer in accordance with claim 1, wherein the surface comprises a sputtering area and a non sputtering area, and a step of covering the non sputtering area of the surface is included between the steps of flattening the porous carrier to form the surface and forming the nickel-chromium alloy layer on the surface of the porous carrier.

6. The method for manufacturing a porous device with restrictive layer in accordance with claim 5, wherein the nickel-chromium alloy layer is formed on the sputtering area of the surface.

7. The method for manufacturing a porous device with restrictive layer in accordance with claim 1, wherein each of the channels is a vent hole, and mentioned vent hole comprises a diameter in the range from 0.001 to 0.8 mm.

8. The method for manufacturing a porous device with restrictive layer in accordance with claim 1, wherein in the step of forming the nickel-chromium alloy layer on the surface of the porous carrier, the forming method of the nickel-chromium alloy layer is chosen from one of vacuum sputtering, vacuum evaporation, or ion implantation.

9. The method for manufacturing a porous device with restrictive layer in accordance with claim 1, wherein in the step of forming the copper metal layer on the nickel-chromium alloy layer, the manufacturing method of mentioned copper metal layer is chosen from one of vacuum sputtering, vacuum evaporation, or ion implantation.

10. The method for manufacturing a porous device with restrictive layer in accordance with claim 1, wherein in the step of forming the nickel metal layer on the copper metal layer, the forming method of mentioned nickel metal layer is chemical deposition.

11. The method for manufacturing a porous device with restrictive layer in accordance with claim 1, wherein in the step of processing mentioned nickel-chromium alloy layer, mentioned copper metal layer and mentioned nickel metal layer, the processing method is chosen from one of laser, electro discharging machining, or micro milling.

12. A porous device with restrictive layer comprising:
 a porous carrier having a micro pore structure; and
 a restrictive layer comprising a nickel-chromium alloy layer disposed on the porous carrier, a copper metal layer disposed on the nickel-chromium alloy layer, a nickel metal layer disposed on the copper metal layer, and a plurality of channels, wherein the nickel metal layer comprises a top surface, and said channels are in communication with the micro pore structure and the top surface.

13. The porous device with restrictive layer in accordance with claim 12, wherein each of the channels is a vent hole, and mentioned vent hole comprises a diameter in the range from 0.001 to 0.8 mm.

* * * * *